(12) United States Patent
Zou

(10) Patent No.: US 11,251,205 B2
(45) Date of Patent: Feb. 15, 2022

(54) DISPLAY PANEL AND CHIP SUITABLE FOR THE DISPLAY PANEL

(71) Applicant: WUHAN CHINA STAR OPTOELECTRONICS TECHNOLOGY CO., LTD., Hubei (CN)

(72) Inventor: Gonghua Zou, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 266 days.

(21) Appl. No.: 16/615,913

(22) PCT Filed: May 10, 2019

(86) PCT No.: PCT/CN2019/086309
§ 371 (c)(1),
(2) Date: Nov. 22, 2019

(87) PCT Pub. No.: WO2020/211133
PCT Pub. Date: Oct. 22, 2020

(65) Prior Publication Data
US 2021/0327907 A1   Oct. 21, 2021

(30) Foreign Application Priority Data

Apr. 15, 2019 (CN) .................. 201910299079.5

(51) Int. Cl.
H01L 27/12       (2006.01)
G02F 1/1345      (2006.01)
H01L 25/18       (2006.01)
H01L 27/32       (2006.01)

(52) U.S. Cl.
CPC ........ *H01L 27/124* (2013.01); *G02F 1/13452* (2013.01); *G02F 1/13456* (2021.01); *H01L 25/18* (2013.01); *H01L 27/3276* (2013.01)

(58) Field of Classification Search
CPC ... H01L 27/124; H01L 27/3276; H01L 25/18; G02F 1/13452; G02F 1/13456
See application file for complete search history.

(56) References Cited

U.S. PATENT DOCUMENTS

2007/0045626 A1*  3/2007  Murade ................ G02F 1/1345
                                                         257/59

\* cited by examiner

*Primary Examiner* — Kyoung Lee

(57) ABSTRACT

The present invention provides a display panel and a chip. A frequency of a signal in a first frequency signal transmission line is greater than a frequency of a signal in a second frequency signal transmission line. A distance between a first signal input pad and a first signal output pad is smaller than a distance between a second signal input pad and a second signal output pad, and the distance between the second signal input pad and the second signal output pad is smaller than a distance between a third signal input pad and a third signal output pad. The invention can reduce the influence of the impedance of the signal transmission line on the signal.

20 Claims, 2 Drawing Sheets

DISPLAY PANEL AND CHIP SUITABLE FOR THE DISPLAY PANEL

CROSS-REFERENCE TO RELATED APPLICATIONS

This application is a 371 U.S. National Stage of International Application No. PCT/CN2019/086309, filed on May 10, 2019, which claims priority to Chinese Application No. 201910299079.5, filed on Apr. 15, 2019. The entire disclosures of the above applications are incorporated herein by reference.

FIELD OF INVENTION

The present invention relates to the field of display technologies, and in particular, to a display panel and a chip suitable for the display panel.

BACKGROUND OF INVENTION

Conventional chip on glass (COG) modules are generally provided with conductive pads for electrically connecting to pins of the chip, and the conductive pads are electrically connected to the traces.

In practice, the inventors have found that prior arts have at least the following problems:

As the number of conductive pads (pins of chips) increase, the conductive pads at the ends away from the chip need to be connected with longer traces. The longer the length of the traces, the greater the impedance. Thus, the impedance-sensitive signal is greatly affected by the impedance of the traces.

Therefore, it is necessary to propose a new technical solution to solve the above technical problems.

SUMMARY OF INVENTION

An object of the present invention is to provide a display panel and a chip suitable for the display panel, which can reduce the influence of the impedance of the signal transmission line on the signal.

In order to solve the above problems, the technical solutions of the present invention are as follow:

A display panel comprises a panel body having a display area and a peripheral area disposed on at least one side of the display area; a potential signal transmission circuit for transmitting a potential signal, the potential signal transmission circuit comprising a first signal input pad, a potential signal transmission line, and a first signal output pad, wherein the potential signal transmission line is electrically connected to the first signal input pad and the first signal output pad; a first frequency signal transmission circuit for transmitting a first frequency signal, the first frequency signal transmission circuit comprising a second signal input pad, a first frequency signal transmission line, and a second signal output pad, wherein the first frequency signal transmission line is electrically connected to the second signal input pad and the second signal output pad; a second frequency signal transmission circuit for transmitting a second frequency signal, the second frequency signal transmission circuit comprising a third signal input pad, a second frequency signal transmission line, and a third signal output pad, and the second frequency signal transmission line is electrically connected to the third signal input pad and the third signal output pad; wherein the potential signal transmission circuit, the first frequency signal transmission circuit, and the second frequency signal transmission circuit are disposed in the peripheral area, and a frequency of the first frequency signal is greater than a frequency of the second frequency signal, a distance between the first signal input pad and the first signal output pad is smaller than a distance between the second signal input pad and the second signal output pad, and the distance between the second signal input pad and the second signal output pad is smaller than a distance between the third signal input pad and the third signal output pad; the first signal input pad, the second signal input pad, and the third signal input pad are arranged in a first direction, the first signal output pad, the second signal output pad, and the third signal output pad are arranged in a second direction; the frequency of the first frequency signal is in a range of 100 megahertz to 1000 megahertz; the frequency of the second frequency signal is in a range of 1 megahertz to 25 megahertz; and an impedance of the potential signal transmission line is smaller than an impedance of the first frequency signal transmission line, and the impedance of the first frequency signal transmission line is smaller than an impedance of the second frequency signal transmission line.

In the above display panel, the first direction is opposite to the second direction.

In the above display panel, an angle between the first direction and the second direction is greater than 90 degrees.

A display panel comprises a panel body having a display area and a peripheral area disposed on at least one side of the display area; a potential signal transmission circuit for transmitting a potential signal, the potential signal transmission circuit comprising a first signal input pad, a potential signal transmission line, and a first signal output pad, wherein the potential signal transmission line is electrically connected to the first signal input pad and the first signal output pad; a first frequency signal transmission circuit for transmitting a first frequency signal, the first frequency signal transmission circuit comprising a second signal input pad, a first frequency signal transmission line, and a second signal output pad, wherein the first frequency signal transmission line is electrically connected to the second signal input pad and the second signal output pad; a second frequency signal transmission circuit for transmitting a second frequency signal, the second frequency signal transmission circuit comprising a third signal input pad, a second frequency signal transmission line, and a third signal output pad, and the second frequency signal transmission line is electrically connected to the third signal input pad and the third signal output pad; wherein the potential signal transmission circuit, the first frequency signal transmission circuit, the second frequency signal transmission circuit are disposed in the peripheral area, and a frequency of the first frequency signal is greater than a frequency of the second frequency signal, a distance between the first signal input pad and the first signal output pad is smaller than a distance between the second signal input pad and the second signal output pad, and the distance between the second signal input pad and the second signal output pad is smaller than a distance between the third signal input pad and the third signal output pad.

In the above display panel, the first signal input pad, the second signal input pad, and the third signal input pad are arranged in a first direction, the first signal output pad, the second signal output pad, and the third signal output pad are arranged in a second direction.

In the above display panel, the first direction is opposite to the second direction.

In the above display panel, an angle between the first direction and the second direction is greater than 90 degrees; the first signal input pad, the second signal input pad, and the third signal input pad are arranged in a step shape.

In the above display panel, the second direction is parallel to a line corresponding to a short side or a long side of the panel body.

In the above display panel, the frequency of the first frequency signal is in a range of 100 megahertz to 1000 megahertz; and the frequency of the second frequency signal is in a range of 1 megahertz to 25 megahertz.

In the above display panel, the first frequency signal includes a low voltage differential signal, and the second frequency signal includes a touch sensing signal.

In the above display panel, an impedance of the potential signal transmission line is smaller than an impedance of the first frequency signal transmission line, and the impedance of the first frequency signal transmission line is smaller than an impedance of the second frequency signal transmission line.

In the above display panel, a length of the potential signal transmission line is smaller than a length of the first frequency signal transmission line, and the length of the first frequency signal transmission line is smaller than a length of the second frequency signal transmission line.

In the above display panel, an area of a cross section of the potential signal transmission line is larger than an area of a cross section of the first frequency signal transmission line, and the area of the cross section of the first frequency signal transmission line is smaller than an area of a cross section of the second frequency signal transmission line.

In the above display panel, a resistivity of the material of the potential signal transmission line is smaller than a resistivity of the material of the first frequency signal transmission line, and the resistivity of the material of the first frequency signal transmission line is smaller than a resistivity of the material of the second frequency signal transmission line.

In the above display panel, the display panel further comprises a flexible circuit board having a flexible circuit board body; a first line connection end for providing the potential signal, and the first line connection end is electrically connected to the first signal input pad; a second line connection end for providing the first frequency signal, and the second line connection end is electrically connected to the second signal input pad; and a third line connection end for providing the second frequency signal, and the third line connection end is electrically connected to the third signal input pad.

In the above display panel, the display panel further comprises a chip having a chip body that is elongated; a first input pin for receiving the potential signal, and the first input pin is electrically connected to the first signal output pad; a second input pin for receiving the first frequency signal, and the second input pin is electrically connected to the second signal output pad; and a third input pin for receiving the second frequency signal, and the third input pin is electrically connected to the third signal output pad; wherein the first input pin, the second input pin, and the third input pin are arranged from one end of the chip body to the other end of the chip body along a length direction of the chip body.

In the above display panel, a combination of the first signal input pad, the second signal input pad, and the third signal input pad is disposed on a combination of the first signal output pad, the second signal output pad, and the third signal output pad, and is disposed on at least on one side of a direction parallel to a line corresponding to a short side or a long side of the panel body.

In the above display panel, when make a gap between the combination of the first signal input pad, the second signal input pad, and the third signal input pad, and the combination of the first signal output pad, the second signal output pad, and the third signal output pad as a reference, the first signal input pad is disposed near the gap, the third signal input pad is disposed away from the gap, and the second signal input pad is disposed between the first signal input pad and the third signal input pad.

In the above display panel, the second frequency signal transmission line encloses at least a portion of the first frequency signal transmission line, and the first frequency signal transmission line encloses at least a portion of the potential signal transmission line.

A chip suitable for a display panel, wherein the chip comprises a chip body that is elongated; a first input pin for receiving the potential signal; a second input pin for receiving the first frequency signal; and a third input pin for receiving the second frequency signal; wherein the first input pin, the second input pin, and the third input pin are arranged from one end of the chip body to the other end of the chip body along a length direction of the chip body.

In the above technical solution, since the distance between the first signal input pad and the first signal output pad is smaller than the distance between the second signal input pad and the second signal output pad, the distance between the second signal input pad and the second signal output pad is smaller than the distance between the third signal input pad and the third signal output pad, the potential signal transmission line, the first frequency signal transmission line, and the second frequency signal transmission line respectively transmit the potential signal, the first frequency signal, and the second frequency signal, and the frequency of the first frequency signal is greater than the frequency of the second frequency signal, therefore, the above technical solution can reduce the influence of the impedance of the signal transmission line on the signal.

In order to make the above description of the present invention more comprehensible, the preferred embodiments are described below, and are described in detail below with reference to the accompanying drawings.

DETAILED DESCRIPTION OF PREFERRED EMBODIMENTS

The term "embodiment" as used in this specification means an example, a sample or an illustration. In addition, the articles "a" or "an" generally can be interpreted as "one or more," unless otherwise specified or the singular form can be clearly determined.

The display panel of the present invention may be a thin film transistor liquid crystal display (TFT-LCD), an organic light emitting diode (OLED), or the like.

Figure 1:
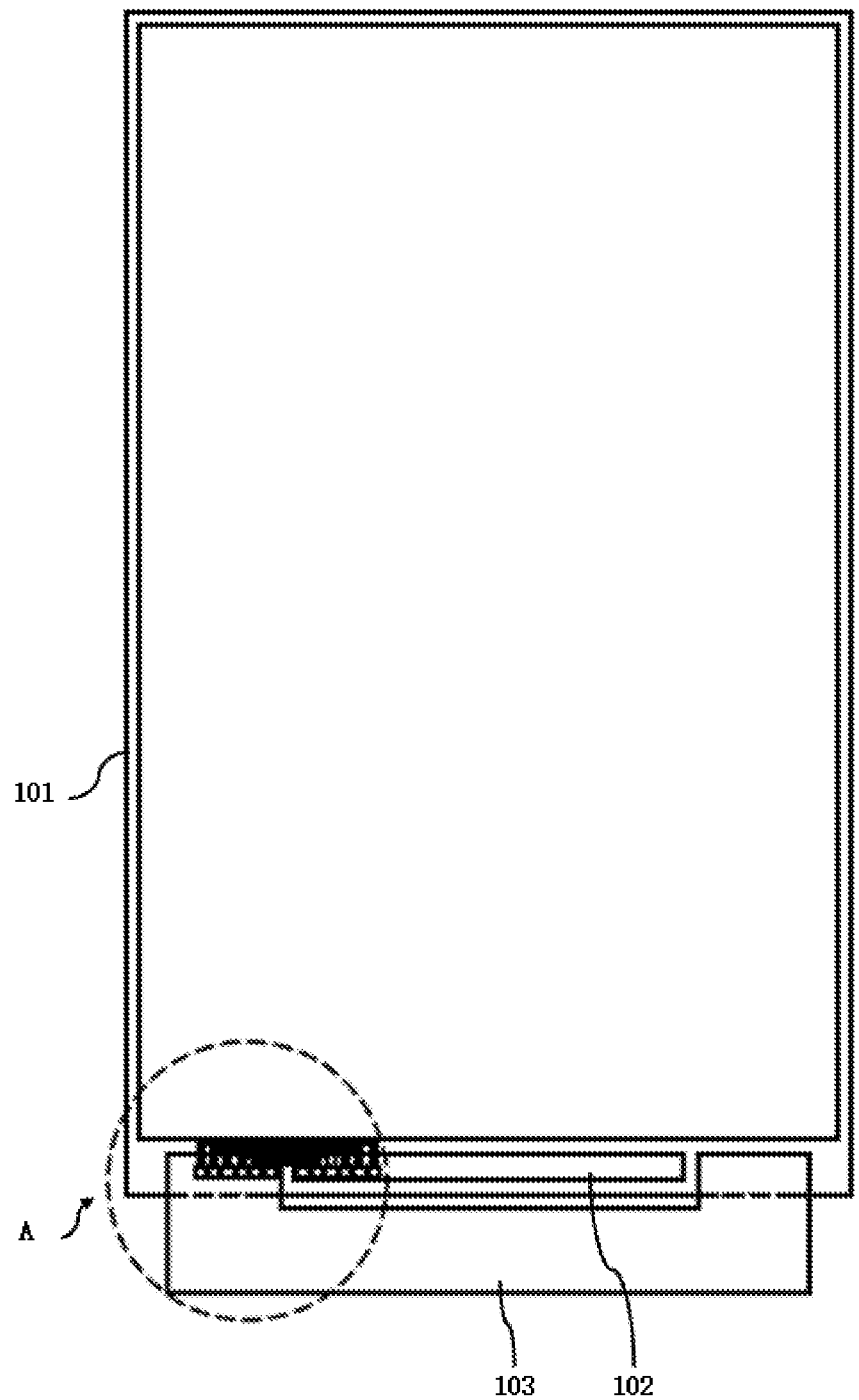
FIG. 1 is a schematic view of a display panel of the present invention.
Figure 2:
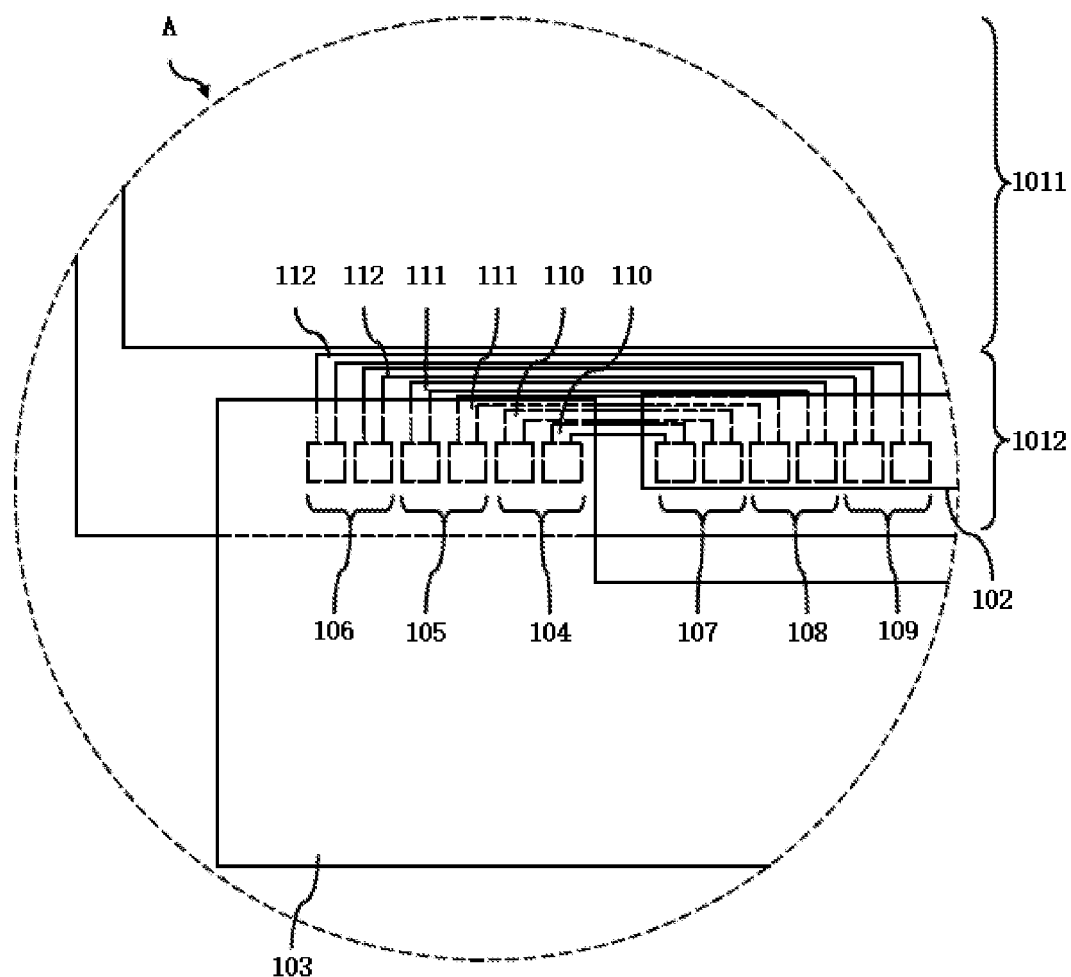
FIG. 2 is a schematic view of an area A in the display panel shown in FIG. 1.

Please refer to FIG. 1 and FIG. 2. FIG. 1 is a schematic view of a display panel of the present invention, and FIG. 2 is a schematic view of an area A in the display panel shown in FIG. 1.

The display panel comprises a panel body 101, a potential signal transmission circuit for transmitting a potential signal, a first frequency signal transmission circuit for transmitting a first frequency signal, and a second frequency signal transmission circuit for transmitting a second frequency signal. The panel body 101 can be, for example, a chip on glass (COG) module.

The panel body 101 includes a display area 1011 and a peripheral area 1012 disposed on at least one side of the display area 1011. For example, the peripheral area 1012 is disposed on one side of the short side of the display area 1011. The potential signal transmission line, the first frequency signal transmission line, and the second frequency signal transmission line are all disposed in the peripheral area 1012.

The potential signal transmission circuit comprises a first signal input pad 104, a potential signal transmission line 110, and a first signal output pad 107. The potential signal transmission line 110 is electrically connected to the first signal input pad 104 and the first signal output pad 107.

The first frequency signal transmission circuit comprises a second signal input pad 105, a first frequency signal transmission line 111, and a second signal output pad 108. The first frequency signal transmission line 111 is electrically connected to the second signal input pad 105 and the second signal output pad 108.

The second frequency signal transmission circuit comprises a third signal input pad 106, a second frequency signal transmission line 112, and a third signal output pad 109. The second frequency signal transmission line 112 is electrically connected to the third signal input pad 106 and the third signal output pad 109.

A frequency of the first frequency signal is greater than a frequency of the second frequency signal. A distance between the first signal input pad 104 and the first signal output pad 107 is smaller than a distance between the second signal input pad 105 and the second signal output pad 108, and the distance between the second signal input pad 105 and the second signal output pad 108 is smaller than a distance between the third signal input pad 106 and the third signal output pad 109.

The first signal input pad 104, the second signal input pad 105, and the third signal input pad 106 are arranged in a first direction. The first signal output pad 107, the second signal output pad 108, and the third signal output pad 109 are arranged in a second direction. Moreover, the first signal output pad 107, the second signal output pad 108, and the third signal output pad 109 are disposed at a short edge portion or a long edge portion of the panel body 101.

A combination of the first signal input pad 104, the second signal input pad 105, and the third signal input pad 106 is disposed on a combination of the first signal output pad 107, the second signal output pad 108, and the third signal output pad 109, and is disposed on at least on one side of the second direction.

When make a gap between the combination of the first signal input pad 104, the second signal input pad 105, and the third signal input pad 106, and the combination of the first signal output pad 107, the second signal output pad 108, and the third signal output pad 109 as a reference, the first signal input pad 104 is disposed near the gap, the third signal input pad 106 is disposed away from the gap, and the second signal input pad 105 is disposed between the first signal input pad 104 and the third signal input pad 106. Similarly, the first signal output pad 107 is disposed near the gap, the third signal output pad 109 is disposed away from the gap, and the second signal output pad 108 is disposed between the first signal output pad 107 and the third signal output pad 109.

As shown in FIG. 2, the first direction is opposite to the second direction, or an angle between the first direction and the second direction is greater than 90 degrees. At this time, the first signal input pad 104, the second signal input pad 105, and the third signal input pad 106 are arranged in a step shape.

The second direction is parallel to a line corresponding to a short side or a long side of the panel body 101.

The frequency of the first frequency signal is in a range of 100 megahertz to 1000 megahertz, and the frequency of the second frequency signal is in a range of 1 megahertz to 25 megahertz.

The potential signal comprises a power signal, the first frequency signal comprises a low voltage differential signal, and the second frequency signal comprises a touch sensing signal.

An impedance of the potential signal transmission line 110 is smaller than an impedance of the first frequency signal transmission line 111, and the impedance of the first frequency signal transmission line 111 is smaller than an impedance of the second frequency signal transmission line 112.

The sensitivity of the potential signal to the impedance is greater than the sensitivity of the first frequency signal to the impedance, and the sensitivity of the first frequency signal to the impedance is greater than the sensitivity of the second frequency signal to the impedance.

In the case where the materials of the potential signal transmission line 110, the first frequency signal transmission line 111, and the second frequency signal transmission line 112 are the same, a length of the potential signal transmission line 110 is smaller than a length of the first frequency signal transmission line 111, and the length of the first frequency signal transmission line 111 is smaller than a length of the second frequency signal transmission line 112. That is, the lengths of the second frequency signal transmission line 112, the first frequency signal transmission line 111, and the potential signal transmission line 110 are gradually decreased, so that the impedances of the second frequency signal transmission line 112, the first frequency signal transmission line 111, and the potential signal transmission line 110 can be gradually reduced.

In the case where the materials of the potential signal transmission line 110, the first frequency signal transmission line 111, and the second frequency signal transmission line 112 are the same, an area of a cross section of the potential signal transmission line 110 is larger than an area of a cross section of the first frequency signal transmission line 111, and the area of the cross section of the first frequency signal transmission line 111 is smaller than an area of a cross section of the second frequency signal transmission line 112. Thus, the impedances of the second frequency signal transmission line 112, the first frequency signal transmission line 111, and the potential signal transmission line 110 can be gradually reduced.

In the case where the potential signal transmission line 110, the first frequency signal transmission line 111, and the second frequency signal transmission line 112 have the same length or cross-sectional area, a resistivity of the material of the potential signal transmission line 110 is smaller than a resistivity of the material of the first frequency signal transmission line 111, and the resistivity of the material of the first frequency signal transmission line 111 is smaller than a resistivity of the material of the second frequency signal transmission line 112.

The second frequency signal transmission line 112 encloses at least a portion of the first frequency signal transmission line 111, and the first frequency signal transmission line 111 encloses at least a portion of the potential signal transmission line 110. The second frequency signal transmission line 112, the first frequency signal transmission line 111, and the potential signal transmission line 110 are parallel arranged.

The display panel further comprises a flexible circuit board 103. The flexible circuit board 103 comprises a flexible circuit board body, a first line connection end for providing the potential signal, a second line connection end for providing the first frequency signal, and a third line connection end for providing the second frequency signal. The first line connection end, the second line connection end, and the third line connection end are exposed on a surface of the flexible circuit board body.

The first line connection end is electrically connected to the first signal input pad 104. The second line connection end is electrically connected to the second signal input pad 105. The third line connection end is electrically connected to the third signal input pad 106.

The display panel further comprises a chip 102. The chip 102 comprises a chip body, a first input pin for receiving the potential signal, a second input pin for receiving the first frequency signal, and a third input pin for receiving the second frequency signal. The first input pin, the second input pin, and the third input pin are disposed on a surface (for example, a bottom surface) of the chip body.

The chip body is elongated.

The first input pin is electrically connected to the first signal output pad 107. The second input pin is electrically connected to the second signal output pad 108. The third input pin is electrically connected to the third signal output pad 109.

The first input pin, the second input pin, and the third input pin are arranged from one end of the chip body to the other end of the chip body along a length direction of the chip body.

The chip 102 further comprises at least two output pins, and the at least two output pins are arranged along the length direction of the chip body.

The display panel further comprises at least two data signal receiving pads and a data signal transmission line. The data signal receiving pads and the data signal transmission line are all disposed in the peripheral area 1012. The data signal transmission line extends from the peripheral area 1012 to the display area 1011. The data signal receiving pads are electrically connected to the data signal transmission line.

The output pin is electrically connected to the data signal receiving pads, and the chip body transmits a data signal to a pixel unit disposed in the display area 1011 through the output pin, the data signal receiving pad, and the data signal transmission line.

As an improvement, in order to prevent a short circuit between two of the first signal input pad 104, the second signal input pad 105, and the third signal input pads 106, or a short circuit between two of the first signal output pad 107, the second signal output pad 108, and the third signal output pads 109, a surface of at least one of the first signal input pad 104, the second signal input pad 105, and the third signal input pad 106 that is parallel to a plane corresponding to the panel body 101 is provided with a first tip portion, and a surface of at least one of the first signal output pad 107, the second signal output pad 108, and the third signal output pad 109 that is parallel to a plane corresponding to the panel body 101 is provided with a second tip portion. The first tip portion is used to collect charges of the first signal input pad 104, the second signal input pad 105, and the third signal input pad 106 to prevent the charges from being released to another adjacent signal input pad, and thus can prevent the short circuit between two of the first signal input pad 104, the second signal input pad 105, and the third signal input pads 106. That is, the first tip portion is used to direct the charges to a position away from another signal input pad. Similarly, the second tip portion is used to collect charges of the first signal output pad 107, the second signal output pad 108, and the third signal output pad 109 to prevent the charges from being released to another adjacent signal input pad, and thus can prevent the short circuit between two of the first signal output pad 107, the second signal output pad 108, and the third signal output pad 109. That is, the second tip portion directs the charges to a position away from the other signal output pad.

A straight line corresponding to the first tip portion and a straight line corresponding to the second tip portion are both perpendicular to a plane corresponding to the panel body 101.

As an improvement, the height (thickness) of any two of the first signal output pad 107, the second signal output pad 108, and the third signal output pad 109 with respect to the plane corresponding to the panel body 101 is not equal to each other. Correspondingly, the lengths of the first input pin, the second input pin, and the third input electrically connected to the first signal output pad 107, the second signal output pad 108, and the third signal output pad 109 are also not equal to each other. A sum of the height of the first signal output pad 107 and the length of the first input pin is equal to a sum of the height of the second signal output pad 108 and the length of the second input pin. A sum of the height of the second signal output pad 108 and the length of the second input pin is equal to a sum of the height of the third signal output pad 109 and the length of the third input pin.

In the above technical solution, since the distance between the first signal input pad 104 and the first signal output pad 107 is smaller than the distance between the second signal input pad 105 and the second signal output pad 108, and the distance between the second signal input pad 105 and the second signal output pad 108 is smaller than the distance between the third signal input pad 106 and the third signal output pad 109, the potential signal transmission line 110, the first frequency signal transmission line 111, and the second frequency signal transmission line 112 respectively transmit the potential signal, the first frequency signal, and the second frequency signal, and the frequency of the first frequency signal is greater than the frequency of the second frequency signal, therefore, the above technical solution can reduce the influence of the impedance of the signal transmission line (i.e. the potential signal transmission line 110, the first frequency signal transmission line 111, and the second frequency signal transmission line 112) on the signal.

In the above, various other corresponding changes and modifications can be made according to the technical solutions and technical ideas of the present invention to those skilled in the art, and all such changes and modifications are within the scope of the claims of the present invention.

What is claimed is:

1. A display panel, comprising:
   a panel body, the panel body comprising a display area and a peripheral area disposed on at least one side of the display area;
   a potential signal transmission circuit for transmitting a potential signal, the potential signal transmission circuit comprising a first signal input pad, a potential signal transmission line, and a first signal output pad, wherein the potential signal transmission line is electrically connected to the first signal input pad and the first signal output pad;
   a first frequency signal transmission circuit for transmitting a first frequency signal, the first frequency signal transmission circuit comprising a second signal input pad, a first frequency signal transmission line, and a second signal output pad, wherein the first frequency signal transmission line is electrically connected to the second signal input pad and the second signal output pad;
   a second frequency signal transmission circuit for transmitting a second frequency signal, the second frequency signal transmission circuit comprising a third signal input pad, a second frequency signal transmission line, and a third signal output pad, and the second frequency signal transmission line is electrically connected to the third signal input pad and the third signal output pad;
   wherein the potential signal transmission circuit, the first frequency signal transmission circuit, and the second frequency signal transmission circuit are disposed in the peripheral area, a frequency of the first frequency signal is greater than a frequency of the second frequency signal, a distance between the first signal input pad and the first signal output pad is smaller than a distance between the second signal input pad and the second signal output pad, and the distance between the second signal input pad and the second signal output pad is smaller than a distance between the third signal input pad and the third signal output pad;
   the first signal input pad, the second signal input pad, and the third signal input pad are arranged in a first direction, the first signal output pad, the second signal output pad, and the third signal output pad are arranged in a second direction;
   the frequency of the first frequency signal is in a range of 100 megahertz to 1000 megahertz;
   the frequency of the second frequency signal is in a range of 1 megahertz to 25 megahertz; and
   an impedance of the potential signal transmission line is smaller than an impedance of the first frequency signal transmission line, and the impedance of the first frequency signal transmission line is smaller than an impedance of the second frequency signal transmission line.

2. The display panel as claimed in claim 1, wherein the first direction is opposite to the second direction.

3. The display panel as claimed in claim 1, wherein an angle between the first direction and the second direction is greater than 90 degrees.

4. A display panel, comprising:
   a panel body, the panel body comprising a display area and a peripheral area disposed on at least one side of the display area;
   a potential signal transmission circuit for transmitting a potential signal, the potential signal transmission circuit comprising a first signal input pad, a potential signal transmission line, and a first signal output pad, wherein the potential signal transmission line is electrically connected to the first signal input pad and the first signal output pad;
   a first frequency signal transmission circuit for transmitting a first frequency signal, the first frequency signal transmission circuit comprising a second signal input pad, a first frequency signal transmission line, and a second signal output pad, wherein the first frequency signal transmission line is electrically connected to the second signal input pad and the second signal output pad;
   a second frequency signal transmission circuit for transmitting a second frequency signal, the second frequency signal transmission circuit comprising a third signal input pad, a second frequency signal transmission line, and a third signal output pad, and the second frequency signal transmission line is electrically connected to the third signal input pad and the third signal output pad;
   wherein the potential signal transmission circuit, the first frequency signal transmission circuit, the second frequency signal transmission circuit are disposed in the peripheral area, and a frequency of the first frequency signal is greater than a frequency of the second frequency signal, a distance between the first signal input pad and the first signal output pad is smaller than a distance between the second signal input pad and the second signal output pad, and the distance between the second signal input pad and the second signal output pad is smaller than a distance between the third signal input pad and the third signal output pad.

5. The display panel as claimed in claim 4, wherein the first signal input pad, the second signal input pad, and the third signal input pad are arranged in a first direction, the first signal output pad, the second signal output pad, and the third signal output pad are arranged in a second direction.

6. The display panel as claimed in claim 5, wherein the first direction is opposite to the second direction.

7. The display panel as claimed in claim 6, wherein an angle between the first direction and the second direction is greater than 90 degrees;
   the first signal input pad, the second signal input pad, and the third signal input pad are arranged in a step shape.

8. The display panel as claimed in claim 6, wherein the second direction is parallel to a line corresponding to a short side or a long side of the panel body.

9. The display panel as claimed in claim 4, wherein the frequency of the first frequency signal is in a range of 100 megahertz to 1000 megahertz; and
   the frequency of the second frequency signal is in a range of 1 megahertz to 25 megahertz.

10. The display panel as claimed in claim 9, wherein the first frequency signal includes a low voltage differential signal, and the second frequency signal includes a touch sensing signal.

11. The display panel as claimed in claim 4, wherein an impedance of the potential signal transmission line is smaller than an impedance of the first frequency signal transmission line, and the impedance of the first frequency signal transmission line is smaller than an impedance of the second frequency signal transmission line.

12. The display panel as claimed in claim 11, wherein a length of the potential signal transmission line is smaller than a length of the first frequency signal transmission line, and the length of the first frequency signal transmission line is smaller than a length of the second frequency signal transmission line.

13. The display panel as claimed in claim 11, wherein an area of a cross section of the potential signal transmission line is larger than an area of a cross section of the first frequency signal transmission line, and the area of the cross section of the first frequency signal transmission line is smaller than an area of a cross section of the second frequency signal transmission line.

14. The display panel as claimed in claim 11, wherein a resistivity of the material of the potential signal transmission line is smaller than a resistivity of the material of the first frequency signal transmission line, and the resistivity of the material of the first frequency signal transmission line is smaller than a resistivity of the material of the second frequency signal transmission line.

15. The display panel as claimed in claim 4, wherein the display panel further comprises a flexible circuit board, and the flexible circuit board comprises:
- a flexible circuit board body;
- a first line connection end for providing the potential signal, and the first line connection end is electrically connected to the first signal input pad;
- a second line connection end for providing the first frequency signal, and the second line connection end is electrically connected to the second signal input pad; and
- a third line connection end for providing the second frequency signal, and the third line connection end is electrically connected to the third signal input pad.

16. The display panel as claimed in claim 4, wherein the display panel further comprises a chip, and the chip comprises:
- a chip body, the chip body is elongated;
- a first input pin for receiving the potential signal, and the first input pin is electrically connected to the first signal output pad;
- a second input pin for receiving the first frequency signal, and the second input pin is electrically connected to the second signal output pad; and
- a third input pin for receiving the second frequency signal, and the third input pin is electrically connected to the third signal output pad;

wherein the first input pin, the second input pin, and the third input pin are arranged from one end of the chip body to the other end of the chip body along a length direction of the chip body.

17. The display panel as claimed in claim 4, wherein a combination of the first signal input pad, the second signal input pad, and the third signal input pad is disposed on a combination of the first signal output pad, the second signal output pad, and the third signal output pad, and is disposed on at least on one side of a direction parallel to a line corresponding to a short side or a long side of the panel body.

18. The display panel as claimed in claim 4, wherein when make a gap between the combination of the first signal input pad, the second signal input pad, and the third signal input pad, and the combination of the first signal output pad, the second signal output pad, and the third signal output pad as a reference, the first signal input pad is disposed near the gap, the third signal input pad is disposed away from the gap, and the second signal input pad is disposed between the first signal input pad and the third signal input pad; the first signal output pad is disposed near the gap, the third signal output pad is disposed away from the gap, and the second signal output pad is disposed between the first signal output pad and the third signal output pad.

19. The display panel as claimed in claim 4, wherein the second frequency signal transmission line encloses at least a portion of the first frequency signal transmission line, and the first frequency signal transmission line encloses at least a portion of the potential signal transmission line.

20. A chip suitable for a display panel as claimed in claim 4, wherein the chip comprises:
- a chip body, the chip body is elongated;
- a first input pin for receiving the potential signal;
- a second input pin for receiving the first frequency signal; and
- a third input pin for receiving the second frequency signal;
- wherein the first input pin, the second input pin, and the third input pin are arranged from one end of the chip body to the other end of the chip body along a length direction of the chip body.

* * * * *